(12) United States Patent
Dussmann et al.

(10) Patent No.: US 9,894,623 B2
(45) Date of Patent: *Feb. 13, 2018

(54) UPLINK PATH INTEGRITY DETECTION IN DISTRIBUTED ANTENNA SYSTEMS

(75) Inventors: Alfons Dussmann, Gansheim (DE); Samuele Brighenti, Faenza (IT)

(73) Assignee: Andrew Wireless Systems GmbH, Buchdorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/428,254

(22) PCT Filed: Sep. 14, 2012

(86) PCT No.: PCT/EP2012/003849
§ 371 (c)(1),
(2), (4) Date: Mar. 13, 2015

(87) PCT Pub. No.: WO2014/040608
PCT Pub. Date: Mar. 20, 2014

(65) Prior Publication Data
US 2015/0249965 A1    Sep. 3, 2015

(51) Int. Cl.
*H04B 7/00* (2006.01)
*H04W 52/52* (2009.01)
(Continued)

(52) U.S. Cl.
CPC .......... *H04W 52/52* (2013.01); *H03G 3/3042* (2013.01); *H04B 7/024* (2013.01);
(Continued)

(58) Field of Classification Search
CPC . H04W 52/146; H04W 52/243; H04W 24/08; H04W 88/085; H04W 52/52;
(Continued)

(56) References Cited

U.S. PATENT DOCUMENTS 4,918,684 A    4/1990  Boschet et al.
5,353,332 A   10/1994  Raith et al.
(Continued)

FOREIGN PATENT DOCUMENTS

CN    101572903    11/2009
CN    101610135    12/2009
(Continued)

OTHER PUBLICATIONS

Avitec , Rolling Out One Seamless 3G Network, retrieved from the internet at http://www.intercomms.net/FEB04/content/avitec.php, at least as early as Aug. 24, 2011, 4 pages.
(Continued)

*Primary Examiner* — Dominic Rego
(74) *Attorney, Agent, or Firm* — Fogg & Powers LLC

(57) ABSTRACT

Aspects and features are directed to an uplink integrity detection sub-system. In one aspect, a distributed antenna system is provided that includes a remote antenna unit that communicates with wireless devices in a coverage area, additional remote antenna units that communicate with wireless devices in additional coverage areas, and a unit that communicates with the remote antenna unit and the additional remote antenna units. The unit includes a distributed antenna system controller. The distributed antenna system controller can determine that an undesirable signal component having a power level exceeding a threshold power is communicated via an uplink path from the remote antenna unit. The distributed antenna system controller can also minimize an impact of the undesirable signal component on the additional coverage areas of the additional remote antenna units. Minimizing the impact can include modifying the gain of the uplink path over which the undesirable signal component is communicated.

23 Claims, 8 Drawing Sheets

(51) Int. Cl.

| | | |
|---|---|---|
| *H03G 3/30* | (2006.01) | |
| *H04B 17/21* | (2015.01) | |
| *H04B 17/345* | (2015.01) | |
| *H04B 7/024* | (2017.01) | |
| *H04W 24/08* | (2009.01) | |
| *H04W 52/14* | (2009.01) | |
| *H04W 52/24* | (2009.01) | |
| *H04W 52/42* | (2009.01) | |
| *H04W 88/08* | (2009.01) | |
| *H04B 17/318* | (2015.01) | |

(52) U.S. Cl.
CPC .......... *H04B 17/21* (2015.01); *H04B 17/345* (2015.01); *H04W 24/08* (2013.01); *H04W 52/146* (2013.01); *H04W 52/243* (2013.01); *H04W 52/42* (2013.01); *H04B 17/318* (2015.01); *H04W 88/085* (2013.01)

(58) Field of Classification Search
CPC ..... H04W 52/42; H04B 7/024; H04B 7/0495; H04B 7/0691; H04B 7/0825; H04B 7/0874; H04B 7/2609; H04B 17/21; H04B 17/345; H04B 17/318; H04G 3/3042
USPC .............................................. 455/522, 68, 69
See application file for complete search history.

(56) References Cited

U.S. PATENT DOCUMENTS

| | | | |
|---|---|---|---|
| 5,507,007 A | 4/1996 | Gunmar et al. | |
| 5,574,466 A | 11/1996 | Reed et al. | |
| 5,594,350 A | 1/1997 | Koizumi et al. | |
| 5,682,256 A | 10/1997 | Motley et al. | |
| 5,691,729 A | 11/1997 | Gutman et al. | |
| 5,694,082 A | 12/1997 | Schmidt | |
| 5,748,001 A | 5/1998 | Cabot | |
| 5,909,642 A | 6/1999 | Suzuki | |
| 6,009,129 A | 12/1999 | Kenney et al. | |
| 6,047,199 A | 4/2000 | DeMarco | |
| 6,128,470 A | 10/2000 | Naidu et al. | |
| 6,128,500 A | 10/2000 | Raghavan et al. | |
| 6,144,692 A | 11/2000 | Beck | |
| 6,366,776 B1 | 4/2002 | Wright et al. | |
| 6,418,327 B1 | 7/2002 | Carey et al. | |
| 6,646,449 B2 | 11/2003 | Seppinen et al. | |
| 6,708,036 B2 | 3/2004 | Proctor et al. | |
| 6,731,237 B2 | 5/2004 | Gustafson et al. | |
| 6,801,767 B1 | 10/2004 | Schwartz et al. | |
| 6,826,164 B2 | 11/2004 | Mani et al. | |
| 6,842,431 B2 | 1/2005 | Clarkson et al. | |
| 6,873,827 B1 | 3/2005 | Wright | |
| 6,895,247 B2 | 5/2005 | Mostafa | |
| 6,937,863 B1 | 8/2005 | Gordon et al. | |
| 6,947,472 B2 | 9/2005 | Blessent | |
| 6,996,374 B1 | 2/2006 | Bao et al. | |
| 7,013,136 B2 | 3/2006 | Frangione et al. | |
| 7,025,262 B2 | 4/2006 | Byskov et al. | |
| 7,082,320 B2 | 7/2006 | Kattukaran et al. | |
| 7,103,377 B2 | 9/2006 | Bauman et al. | |
| 7,120,546 B2 | 10/2006 | Zyss et al. | |
| 7,123,023 B2 | 10/2006 | Minihold et al. | |
| 7,127,175 B2 | 10/2006 | Mani et al. | |
| 7,127,211 B2 | 10/2006 | Hildebrand et al. | |
| 7,167,507 B2 | 1/2007 | Mailaender et al. | |
| 7,200,391 B2 | 4/2007 | Chung et al. | |
| 7,205,864 B2 | 4/2007 | Schultz, Jr. et al. | |
| 7,224,170 B2 * | 5/2007 | Graham ................ | H01Q 3/267 324/522 |
| 7,272,408 B2 | 9/2007 | Dalal et al. | |
| 7,286,507 B1 | 10/2007 | Oh et al. | |
| 7,313,415 B2 | 12/2007 | Wake et al. | |
| 7,394,826 B2 * | 7/2008 | Cain ................ | H04L 1/0017 370/230.1 |
| 7,403,503 B2 | 7/2008 | Cuffaro et al. | |
| 7,447,490 B2 | 11/2008 | Kuo et al. | |
| 7,466,750 B2 | 12/2008 | Kim et al. | |
| 7,469,105 B2 | 12/2008 | Wake et al. | |
| 7,474,635 B2 | 1/2009 | Linsky et al. | |
| 7,603,093 B2 | 10/2009 | Kremer et al. | |
| 7,792,226 B2 | 9/2010 | Yu et al. | |
| 7,831,257 B2 | 11/2010 | Pollman et al. | |
| 7,852,951 B2 | 12/2010 | Kalluri et al. | |
| 7,876,867 B2 | 1/2011 | Filipovic et al. | |
| 7,974,244 B2 | 7/2011 | Hermel | |
| 7,983,645 B2 | 7/2011 | Broyde et al. | |
| 8,175,540 B2 | 5/2012 | Jones | |
| 8,515,339 B2 | 8/2013 | Yona et al. | |
| 8,831,593 B2 | 9/2014 | Melester et al. | |
| 9,036,486 B2 | 5/2015 | Maca et al. | |
| 9,312,895 B1 * | 4/2016 | Gupta ................... | H04B 1/109 |
| 2002/0094785 A1 | 7/2002 | Deats | |
| 2003/0039319 A1 | 2/2003 | Engelse et al. | |
| 2003/0040329 A1 | 2/2003 | Yona et al. | |
| 2003/0073463 A1 | 4/2003 | Shapira | |
| 2003/0153273 A1 | 8/2003 | Ebert et al. | |
| 2003/0157967 A1 | 8/2003 | Saunders et al. | |
| 2005/0102449 A1 | 5/2005 | Durston | |
| 2005/0185593 A1 | 8/2005 | Yen et al. | |
| 2005/0259684 A1 | 11/2005 | Csapo | |
| 2005/0282506 A1 | 12/2005 | Azuma | |
| 2006/0002326 A1 | 1/2006 | Vesuna | |
| 2006/0019679 A1 | 1/2006 | Rappaport et al. | |
| 2006/0094470 A1 | 5/2006 | Wake et al. | |
| 2007/0010224 A1 | 1/2007 | Shi | |
| 2007/0135056 A1 | 6/2007 | Kremer et al. | |
| 2007/0213006 A1 | 9/2007 | Wong et al. | |
| 2007/0259625 A1 | 11/2007 | Tolaio et al. | |
| 2008/0039089 A1 | 2/2008 | Berkman et al. | |
| 2008/0198955 A1 | 8/2008 | Oren et al. | |
| 2008/0200117 A1 | 8/2008 | Oren et al. | |
| 2008/0287083 A1 | 11/2008 | Payne, IV | |
| 2008/0298445 A1 | 12/2008 | Richardson et al. | |
| 2009/0017835 A1 | 1/2009 | Song et al. | |
| 2009/0023403 A1 * | 1/2009 | LaBerge ................ | H04B 15/02 455/114.2 |
| 2009/0027282 A1 | 1/2009 | Finn et al. | |
| 2009/0086028 A1 | 4/2009 | Miller et al. | |
| 2009/0086864 A1 | 4/2009 | Komninakis et al. | |
| 2009/0239475 A1 | 9/2009 | Lehman | |
| 2009/0298422 A1 | 12/2009 | Conroy et al. | |
| 2010/0029237 A1 | 2/2010 | Yamamoto et al. | |
| 2010/0085061 A1 | 4/2010 | Bradley et al. | |
| 2010/0113006 A1 | 5/2010 | Pajjuri et al. | |
| 2010/0128676 A1 | 5/2010 | Wu et al. | |
| 2010/0135437 A1 | 6/2010 | Lee et al. | |
| 2010/0142390 A1 * | 6/2010 | Sun ...................... | H04B 7/0452 370/252 |
| 2010/0142663 A1 | 6/2010 | Yoon et al. | |
| 2010/0164504 A1 | 7/2010 | Bradley | |
| 2010/0178936 A1 | 7/2010 | Wala et al. | |
| 2010/0197238 A1 | 8/2010 | Pathuri et al. | |
| 2010/0202356 A1 | 8/2010 | Fischer et al. | |
| 2010/0260103 A1 | 10/2010 | Guey et al. | |
| 2010/0278530 A1 | 11/2010 | Kummetz et al. | |
| 2010/0295533 A1 | 11/2010 | Kuga et al. | |
| 2011/0059709 A1 | 3/2011 | Collins, III | |
| 2011/0080847 A1 | 4/2011 | Kenkel et al. | |
| 2011/0085490 A1 | 4/2011 | Schlee | |
| 2011/0105184 A1 | 5/2011 | Piirainen et al. | |
| 2011/0135308 A1 | 6/2011 | Tarlazzi et al. | |
| 2011/0151839 A1 | 6/2011 | Bolon et al. | |
| 2011/0158211 A1 * | 6/2011 | Gaal ................. | H04L 25/0206 370/338 |
| 2011/0164878 A1 | 7/2011 | Ma et al. | |
| 2011/0201269 A1 | 8/2011 | Hobbs et al. | |
| 2011/0237182 A1 | 9/2011 | Stratford et al. | |
| 2012/0093269 A1 | 4/2012 | Yu et al. | |
| 2012/0134666 A1 | 5/2012 | Casterline et al. | |
| 2012/0140685 A1 | 6/2012 | Lederer et al. | |
| 2012/0282889 A1 * | 11/2012 | Tanaka ............... | H04J 11/0053 455/405 |

(56) References Cited

U.S. PATENT DOCUMENTS

| | | | | |
|---|---|---|---|---|
| 2012/0309328 | A1* | 12/2012 | Morrison | H04B 1/525 455/78 |
| 2013/0017863 | A1 | 1/2013 | Kummetz et al. | |
| 2013/0071112 | A1* | 3/2013 | Melester | H04W 52/24 398/38 |
| 2013/0095870 | A1* | 4/2013 | Phillips | H04W 52/146 455/501 |
| 2013/0182753 | A1 | 7/2013 | Delforce et al. | |
| 2013/0260705 | A1* | 10/2013 | Stratford | H04B 17/12 455/226.1 |
| 2014/0024402 | A1* | 1/2014 | Singh | H04B 17/23 455/501 |
| 2014/0119197 | A1 | 5/2014 | Maca et al. | |
| 2015/0078191 | A1* | 3/2015 | Jongren | H04L 1/0026 370/252 |
| 2016/0337050 | A1 | 11/2016 | Melester et al. | |

FOREIGN PATENT DOCUMENTS

| | | |
|---|---|---|
| CN | 101635590 | 1/2010 |
| CN | 103733664 | 4/2014 |
| CN | 103875270 | 6/2014 |
| CN | 103891179 | 6/2014 |
| EP | 1081883 | 3/2001 |
| EP | 2661828 | 11/2013 |
| EP | 2732653 | 5/2014 |
| EP | 2756619 | 7/2014 |
| HK | 1198078 | 11/2014 |
| JP | 2002190780 | 7/2002 |
| JP | 2005151189 | 6/2005 |
| KR | 19980067669 | 2/1997 |
| KR | 20020041516 | 6/2002 |
| KR | 2005049070 | 5/2005 |
| KR | 20060120361 | 11/2006 |
| KR | 20070117791 | 12/2007 |
| KR | 20070118460 | 12/2007 |
| KR | 20080086604 | 9/2008 |
| KR | 20090010523 | 1/2009 |
| KR | 20090080762 | 7/2009 |
| WO | 9739597 | 10/1997 |
| WO | 2005109700 | 11/2005 |
| WO | 2007044653 | 4/2007 |
| WO | 2008027213 | 3/2008 |
| WO | 2008088862 | 7/2008 |
| WO | 2009039396 | 3/2009 |
| WO | 2009082084 | 7/2009 |
| WO | 2011156465 | 12/2011 |
| WO | 2013009835 | 1/2013 |
| WO | 2013033199 | 3/2013 |
| WO | 2013040579 | 3/2013 |
| WO | 2013040589 | 3/2013 |

OTHER PUBLICATIONS

International Patent Application No. PCT/EP2012/003849 , International Search Report, mailed May 24, 2013, 4 pages.
United States Patent and Trademark Office, "Office Action", "from U.S. Appl. No. 13/546,425", dated Jul. 31, 2014, pp. 1-16, Published in: U.S.
United States Patent and Trademark Office, "Final Office Action", "from U.S. Appl. No. 13/546,425", dated Feb. 24, 2015, pp. 1-20, Published in: U.S.
International Searching Authority, "International Preliminary Report on Patentability from PCT Application No. PCT/US2012/046207", "from Foreign Counterpart to U.S. Appl. No. 13/546,425", dated Jan. 23, 2014, pp. 1-7, Published in: WO.
International Searching Authority, "International Search Report for PCT Application No. PCT/US2012/046207", "from Foreign Counterpart to U.S. Appl. No. 13/546,425", dated Nov. 15, 2012, pp. 1-9, Published in: WO.
European Patent Office, "Extended European Search Report for EP Application No. 12826731.7", "from Foreign Counterpart to U.S. Appl. No. 13/597,900", dated Mar. 12, 2015, pp. 1-10, Published in: EP.
International Search Authority, "International Search Report for PCT Application No. PCT/US2012/052845", "from Foreign Counterpart to U.S. Appl. No. 13/597,900", dated Jan. 30, 2013, pp. 1-8, Published in: WO.
European Patent Office, "Extended European Search Report from 12832171.8", "from U.S. Appl. No. 13/978,966", dated Apr. 24, 2014, pp. 1-9, Published in: EP.
European Patent Office, "Extended European Search Report for EP Application No. 16150415.4", "from Foreign Counterpart to U.S. Appl. No. 13/978,966", Apr. 15, 2016, pp. 1-10, Published in: EP.
European Patent Office, "Communication under Rule 71(3) for EP Application No. 12832171.8", "from Foreign Counterpart to U.S. Appl. No. 13/978,966", Sep. 25, 2015, pp. 1-108, Published in: EP.
European Patent Office, "Office Action for EP Application No. 12832171.8", "from Foreign Couterpart for U.S. Appl. No. 13/978,966", Feb. 13, 2015, pp. 1-6, Published in: EP.
European Patent Office, "Communication under Rule 71(3) EPC for EP Application No. 16150415.4", "From U.S. Appl. No. 13/978,966", Apr. 4, 2017, pp. 1-58, Published in: EP.
United States Patent and Trademark Office, "Final Office Action", "from U.S. Appl. No. 13/978,966", dated Sep. 5, 2014, pp. 1-32, Published in: U.S.
United States Patent and Trademark Office, "Notice of Allowance", "from U.S. Appl. No. 13/978,966", dated Jan. 21, 2015, pp. 1-8, Published in: U.S.
United States Patent and Trademark Office, "Office Action", "from U.S. Appl. No. 13/978,966", Apr. 15, 2014, pp. 1-34, Published in: U.S.
U.S. Patent Office, "Office Action", "from U.S. Appl. No. 14/676,275", dated Feb. 23, 2017, pp. 1-27, Published in: U.S.
International Search Authority, "International Preliminary Report on Patentability for PCT/US2012/055793", "from Foreign Counterpart to U.S. Appl. No. 13/978,966", dated Mar. 27, 2014, pp. 1-6, Published in: WO.
International Search Authority, "International Search Report and Written Opinion for PCT/US2012/055793", "from Foreign Counterpart to U.S. Appl. No. 13/978,966", dated Dec. 28, 2012, pp. 1-9, Published in: WO.
Australian Government IP Australia, "Notice of Acceptance for Patent Application", "Foreign Counterpart to U.S. Appl. No. 13/621,504", Feb. 14, 2017, pp. 1-3, Published in: AU.
Australian Patent Office, "Office Action for AU 2012308170", "from Foreign Counterpart to U.S. Appl. No. 13/621,504", dated Feb. 11, 2016, pp. 1-4, Published in: AU.
China Patent Office, "Notice of Allowance for CN Application No. 20120050939.8", "from Foreign Counterpart to U.S. Appl. No. 13/621,504", Jun. 19, 2015, pp. 1-3, Published in: CN.
State Intellectual Property Office of the People'S Republic of China, "First Office Action for CN Application No. 201280050939.8", "from U.S. Appl. No. 13/621,504", Dec. 3, 2014, pp. 1-11, Published in: CN.
European Patent Office, "Partial European Search Report for EP Application No. 12832025.6", "from Foreign Counterpart to U.S. Appl. No. 13/621,504", Mar. 12, 2015, pp. 1-7, Published in: EP.
European Patent Office, "Extended European Search Report for EP Application No. EP12832025.6", "from Foreign Counterpart to U.S. Appl. No. 13/621,504", dated Jul. 2, 2015, pp. 1-12, Published in: EP.
European Patent Office, "Communication under Rule 71(3) for EP Application No. 12832025.6", "from Foreign Counterpart to U.S. Appl. No. 13/621,504", dated Oct. 6, 2016, pp. 1-46, Published in: EP.
European Patent Office, "Office Action for EP Application No. 12832025.6", "from Foreign Counterpart to U.S. Appl. No. 13/621,504", dated May 10, 2016, pp. 1-4, Published in: EP.
European Patent Office, "Partial European Search Report for EP Application No. 17159052.4", "from Foreign Counterpart to U.S. Appl. No. 13/621,504", dated Mar. 27, 2017, pp. 1-9, Published in: EP.

(56) References Cited

OTHER PUBLICATIONS

European Patent Office, "Extended European Search Report for EP Application No. 17159062.3", "from Foreign Counterpart to U.S. Appl. No. 13/621,504", dated Mar. 28, 2017, pp. 1-12, Published in: EP.

U.S. Patent Office, "Notice of Allowance", "from U.S. Appl. No. 13/621,504", Jun. 18, 2014, pp. 1-7, Published in: U.S.

United States Patent and Trademark Office, "Office Action", "from U.S. Appl. No. 13/621,504", dated Feb. 13, 2014, pp. 1-28, Published in: U.S.

United States Patent and Trademark Office, "Advisory Action", "from U.S. Appl. No. 14/448,080", dated Jan. 26, 2017, pp. 1-14, Published in: U.S.

United States Patent and Trademark Office, "Final Office Action", "from U.S. Appl. No. 14/448,080", dated Nov. 10, 2016, pp. 1-29, Published in: U.S.

United States Patent and Trademark Office, "Office Action", "from U.S. Appl. No. 14/448,080", dated Jun. 15, 2016, pp. 1-25, Published in: U.S.

International Search Authority, "International Preliminary Report on Patentability", "from International Application No. PCT/US2012/055807", dated Mar. 27, 2014, pp. 1-6, Published in: WO.

International Search Authority, "International Search Report and Written Opinion", "International Patent Application No. PCT/US2012/055807", dated Dec. 26, 2012, pp. 1-7, Published in: WO.

Bell et al., "Range to Fault Technology", "http://www.livingston.co.uk/files/bestanden/rtfwhitepaper.pdf", Jan. 1, 2011, pp. 1-10, Publisher: Kaelus, Inc.

Brahmanapally et al., "Analysis and Determination of intermodulation hits in Mobile Communication", "Proceedings of the 8th WSEAS International Conference on Data Networks, Communications, Computers, DNCOCO 09 (Provided one page abstract only)", Nov. 7, 2009, pp. 130-134.

Chalmers, "Detecting and Correcting Intermodulation", "Global Communications (Provided one page abstract only)", dated Jan. 1, 1985, pp. 22-25, vol. 7, No. 1.

Feng et al., "Downlink Capacity of Distributed Antenna Systems in a Multi-Cell Environment", "Communications and Networking", Sep. 1, 2010, pp. 173-186.

Heath, Jr. et al., "Multiuser MIMO in Distributed Antenna Systems", "Signals, Systems and Computers (ASILOMAR), 2010 Conference Record of the Forty Fourth Asilomar Conference", Nov. 1, 2010, pp. 1-5.

"An Introduction to Neutral Host Distributed Antenna Systems", Nov. 7, 2004, pp. 1-14, Publisher: Infinigy Networks.

Niash, "Intermodulation Distortion Problems at UMTS Cell Sites", "http://www.aeroflex.com/ats/products/prodfiles/articles/8814/Intermod.pdf", Jan. 3, 2010, pp. 1-10, Publisher: Aeroflex Wireless Test Solutions, Published in: Burnham, UK.

Qiang et al., "Study on Computer-Based Integrated Passive Inter-Modualtion Measurement System", "Chinese Journal of Scientific Instrument (Provided one page abstract only)", Jul. 1, 2009, pp. 1540-1545.

Singh et al., "Systems Methodology for PIM Mitigation of Communications Satellites", "ESA 4th International Workshop on Multipactor, Corona and Passive Intermodulation in Space RF Hardware", Sep. 10, 2003, pp. 1-11, Published in: U.S.

"Distributed Antenna Systems and MIMO Technology", Apr. 1, 2011, pp. 1-8, Publisher: TE Connectivity Wireless and Services.

Tolstrup, "Noise, Indoor Radio Planning", Jul. 14, 2011, pp. 295-328.

United States Patent and Trademark Office, "Final Office Action from U.S. Appl. No. 14/676,275", "from U.S. Appl. No. 14/676,275 dated Sep. 13, 2017", Sep. 13, 2017, pp. 1-44, Published in: U.S.

European Patent Office, "Extended European Search Report from EP Application No. 17159052.4 dated Jul. 3, 2017", "from Foreign Counterpart of U.S. Appl. No. 13/621,504 dated Jul. 3, 2017", Jul. 3, 2017, pp. 1-15, Published in: EP.

United States Patent and Trademark Office, "Office Action", "From U.S. Appl. No. 14/448,080", dated Jun. 30, 2017, pp. 1-42, Published in: U.S.

United States Patent and Trademark Office, "Office Action", "From U.S. Appl. No. 15/220,147", dated Jul. 6, 2017, pp. 1-51, Published in: U.S.

Morten, Tolstrup, "Noise", "Indoor Radio Planning", Jul. 14, 2011, pp. 295-328, Publisher: John Wiley & Sons, Ltd., Published in: Chichester, UK.

U.S. Patent and Trademark Office, "Advisory Action", "U.S. Appl. No. 14/676,275", dated Dec. 15, 2017.

U.S. Patent and Trademark Office, "Final Office Action", "from U.S. Appl. No. 14/448,080", dated Nov. 24, 2017, pp. 1-30, Published in: U.S.

\* cited by examiner

UPLINK PATH INTEGRITY DETECTION IN DISTRIBUTED ANTENNA SYSTEMS

CROSS-REFERENCE TO RELATED APPLICATIONS

This is a U.S. national phase under 35 U.S.C. 371 of International Patent Application No. PCT/EP2012/003849, titled "Uplink Path Integrity Detection in Distributed Antenna Systems" and filed Sep. 14, 2012, the entirety of which is incorporated herein by reference.

TECHNICAL FIELD

This disclosure relates generally to telecommunications systems and more particularly relates to reducing impacts of undesirable signal components from remote antenna units in distributed antenna systems.

BACKGROUND

A distributed antenna system can include multiple remote antenna units in communication with a master unit. In the uplink direction, uplink signals from the remote antenna units are combined at the master unit. Each of the uplink signals can include undesirable signal components, such as noise or interfering signals, added to the uplink signals by the remote antenna unit or other source. Uplink paths from different remote antenna units to the master unit can be characterized by different signal gains. Consequently, the remote antenna units can contribute different amounts of noise to the combined uplink signal generated by the master unit.

Uplink signals including undesirable signal components can be combined with other uplink signals by, for example, a master unit of a distributed antenna system. Combining uplink signals including undesirable signal components with other uplink signals can cause corruption of data or other information communicated via the uplink signals, thereby decreasing the signal coverage provided by the distributed antenna system.

Systems and methods that can identify undesirable signal components of one or more remote antenna units to determine the integrity of an uplink path are desirable.

SUMMARY

Certain aspects and features of the present invention are directed to an uplink integrity detection sub-system. In one aspect, a distributed antenna system is provided. The distributed antenna system includes a remote antenna unit that can communicate with wireless devices in a coverage area, one or more additional remote antenna units that can communicate with wireless devices in one or more additional coverage areas, and a unit that can communicate with the remote antenna unit and the one or more additional remote antenna units. The unit includes a distributed antenna system controller. The distributed antenna system controller can determine that an undesirable signal component having a signal power exceeding a threshold power is communicated via an uplink path from the remote antenna unit. The distributed antenna system controller can also minimize an impact of the undesirable signal component on the additional coverage areas of the one or more additional remote antenna units. Minimizing the impact can include modifying the gain of the uplink path over which the undesirable signal component is communicated and thereby added to combined signals communicated from the one or more additional remote antenna units.

In another aspect, an uplink integrity detection sub-system is provided. The uplink integrity detection sub-system includes a test signal generator disposed in a remote antenna unit of a distributed antenna system, a power detector disposed in a unit of the distributed antenna system, and a distributed antenna system controller disposed in the unit. Non-limiting examples of a unit can include a master unit, an uplink measurement receiver, a base station router or other point of interface ("POI"), and the like. The unit can communicate with multiple remote antenna units of the distributed antenna system. The test signal generator can provide a test signal to an uplink path of the distributed antenna system. The power detector can measure, at a measurement point an output power of the test signal. An example of a measurement point can include (but is not limited to) the input to a combiner of a master unit. The output power of the test signal can be a function of an input power of the test signal as modified by the test signal traversing the uplink path from the remote antenna unit. The distributed antenna system controller can determine a noise figure of the remote antenna unit based on the output power of the test signal and the input power of the test signal. In some aspects, the distributed antenna system controller can control other components of the uplink integrity detection sub-system.

In another aspect, an uplink integrity detection sub-system is provided that includes a remote antenna unit of a distributed antenna system. The remote antenna unit includes a measurement receiver and a controller. The measurement receiver can measure the signal power of an undesirable signal component having a frequency in an uplink frequency band used by the remote antenna unit for communicating uplink signals. The controller can determine that the signal power of an undesirable signal component exceeds a threshold signal power. The controller can configure an attenuator disposed in the remote antenna unit to attenuate the uplink signal based on the signal power of the undesirable signal component.

These illustrative aspects and examples are mentioned not to limit or define the invention, but to provide examples to aid understanding of the inventive concepts disclosed in this application. Other aspects, advantages, and features of the present invention will become apparent after review of the entire application.

DETAILED DESCRIPTION

Figure 1:
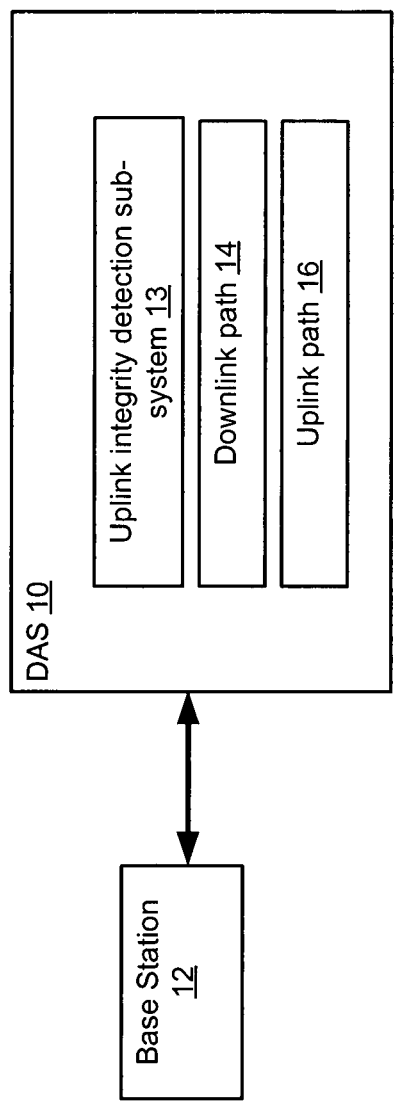
FIG. 1 is a block diagram of a base station coupled to a DAS that has an uplink integrity detection sub-system according to one aspect.

Certain aspects and examples are directed to an uplink integrity detection sub-system that can be disposed in a distributed antenna system ("DAS"). For example, a DAS can include a unit, such as a master unit, in communication with multiple remote antenna units. Each remote antenna unit can communicate with wireless devices in a respective coverage area. The master unit or another unit can include a system controller. The system controller can determine that an undesirable signal component having a signal power exceeding a threshold power is being communicated via an uplink path from a remote antenna unit. An undesirable signal component can include any component that can corrupt the integrity of a first uplink signal or a second uplink signal combined with the first uplink signal. Corrupting an uplink signal can include overdriving one or more devices of the DAS such that information transmitted via the uplink signal is lost or otherwise degraded. The system controller can minimize an impact of the undesirable signal component on coverage areas of other remote antenna units by modifying the gain of the uplink path over which the undesirable signal component is communicated.

In some aspects, minimizing an undesirable signal component can include reducing a noise contribution from a remote antenna unit. An uplink integrity detection sub-system can minimize the noise contribution. The uplink integrity detection sub-system can include a test signal generator disposed in one or more remote antenna units of a DAS, a power detector disposed in a master unit or other unit of the DAS, and a DAS controller disposed in the unit. The test signal generator can provide a test signal to an uplink path of the DAS. The power detector can measure, at a measurement point, an output power of the test signal. The output power of the test signal can be a function of an input power of the test signal as modified by the test signal traversing the uplink path.

The DAS controller can determine a noise figure of the remote antenna unit based on the output power of the test signal and the input power of the test signal. The DAS controller can determine that the noise figure is excessive for a given remote antenna unit among a group of remote antenna units. The excessive noise contribution can prevent a base station from distinguishing a signal from another remote antenna unit from the noise caused by the remote antenna unit having an excessive noise figure. An excessive noise figure can exceed a desired threshold. The threshold can be, for example, the noise figure of the remote antenna unit when the DAS is tested in a testing environment or other production environment. Examples of an excessive noise contribution of a remote antenna unit can include, but are not limited to, a noise level with a power greater than the maximum specified by a manufacturer of a remote antenna unit or a noise level with a power greater than that caused by a noise figure determined for the remote antenna unit in a testing environment or other production environment. A testing environment can be, for example, a DAS including one or more master units and one or more remote antenna units. The testing environment or other production environment can measure different parameters, such as gain or noise figure, of the components of a DAS, such as the master units and remote antenna units. For example, in a testing environment or other production environment, it can be determined that a remote antenna unit in having a noise figure in excess of 7 dB can result in an excessive noise contribution from the remote antenna unit. The threshold noise figure can therefore be determined as 7 dB. The remote antenna unit having the excessive noise figure can cause an excessive noise contribution relative to the noise contribution from each of the other remote antenna units in communication with the master unit. The excessive noise contribution can, for example, prevent the base station from distinguishing signals from the other remote antenna units from the noise of the remote antenna unit having the excessive noise figure.

The uplink integrity detection sub-system can compensate for the noise contribution of a remote antenna unit having an excessive noise figure by determining a noise figure and output noise floor for an uplink path from each remote antenna unit prior to combining uplink paths at a master unit or any other node in the DAS. In some aspects, the uplink integrity detection sub-system can reduce the gain of an uplink path from the remote antenna unit having the excessive noise figure. In other aspects, the uplink integrity detection sub-system can increase the gain of uplink paths from remote antenna units not having an excessive noise figure. In other aspects, the uplink integrity detection sub-system can adjust the gain of uplink paths from the remote antenna units in communication with the master unit so as to equalize the noise contributed by each remote antenna unit at the input to a combiner, such a summer, in the master unit.

In additional or alternative aspects, minimizing an undesirable signal component can include minimizing or otherwise controlling an undesirable signal component that is an interfering signal received by a remote antenna unit. An interfering signal can include an extraneous signal received by a remote antenna unit having a frequency within an uplink frequency band. An interfering signal can include an intermodulation product having a frequency within an uplink frequency band that is generated by extraneous signals received by the remote antenna unit.

The uplink integrity detection sub-system can include a measurement receiver and a controller disposed in one or more remote antenna units. The measurement receiver can measure the signal power of an interfering signal received by the remote antenna unit. The controller can determine that the signal power of the interfering signal exceeds a threshold signal power. The controller can configure an attenuator disposed in the remote antenna unit to attenuate the uplink signal based on the signal power of the interfering signal. The controller can also generate a control message for transmission to a master unit receiving the uplink signal. The control message can specify additional adjustments to the gain of the uplink paths from to the master unit.

Detailed descriptions of certain aspects are discussed below. These illustrative examples are given to introduce the reader to the general subject matter discussed here and are not intended to limit the scope of the disclosed concepts. The following sections describe various additional aspects and examples with reference to the drawings in which like numerals indicate like elements, and directional descriptions are used to describe the illustrative examples but, like the illustrative examples, should not be used to limit the present invention.

FIG. 1 depicts an uplink integrity detection sub-system 13 disposed in a DAS 10. The DAS 10 in FIG. 1 also includes a downlink path 14 and an uplink path 16. The downlink path 14 can be used for communicating downlink signals from a base station 12 to a remote antenna unit. Downlink signals are signals at frequencies in a downlink frequency band provided from a base station 12 to a remote antenna for radiation to wireless devices. The uplink path 16 can be used for communicating uplink signals from a remote antenna unit to the base station 12. Uplink signals are signals at frequencies in an uplink frequency band that are recovered by a remote antenna from wireless devices in a coverage area serviced by the remote antenna unit. In some aspects, the DAS 10 can be a system, such as (but not limited to) a time-division duplexing ("TDD") system, using the same frequency band for communicating both downlink signal and uplink signals.

Uplink signals transported over the links provided by different remote antenna units or otherwise communicated via uplink paths from different remote antenna units can be combined at a master unit. The uplink integrity detection sub-system 13 can compensate for the noise contribution of remote antenna units having excessive noise figures to the combined uplink signal traversing the uplink path 16.

Figure 2:
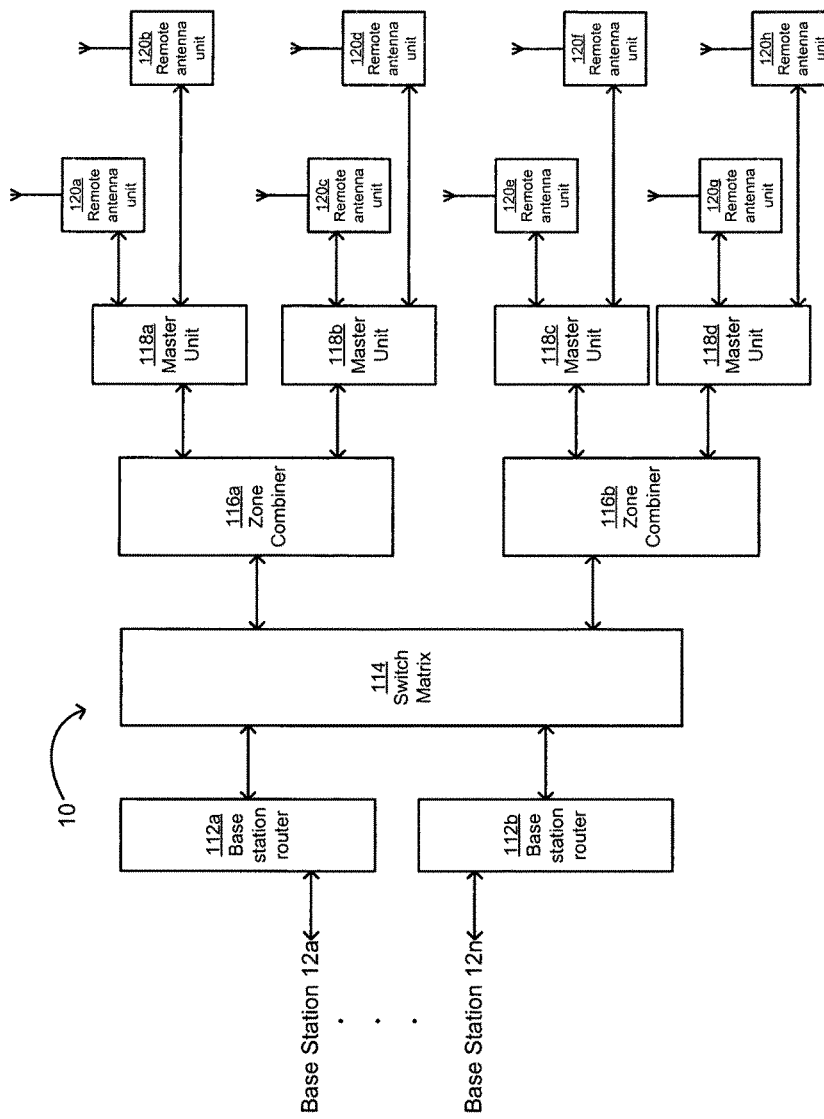
FIG. 2 is a block diagram of a DAS in which an uplink integrity detection sub-system can be disposed according to one aspect.

FIG. 2 depicts an exemplary DAS 10 having base station routers 112a, 112b in communication with base stations 12a-n and a switch matrix 114. The DAS 10 can also include master units 118a-d in communication with zone combiners 116a, 116b and the remote antenna units 120a-h. Each of the zone combiners 116a, 116b can combine uplink signals from more than one master unit and provide a combined uplink signal to one of the base station routers 112a, 112b selected via the switch matrix 114. In some aspects, the switch matrix 114 and zone combiners 116a, 116b can be omitted and the master units 118a-d can communicate directly with base station router 112a or base station router 112b. The DAS 10 can be positioned in an area to extend wireless communication coverage.

In the direction of a downlink path 14, the DAS 10 can receive signals from the base stations 12a-n via a wired or wireless communication medium. Downlink signals can be received by the base station routers 112a, 112b. The base station routers 112a, 112b can provide the downlink signals to the master units 118a-d via the switch matrix 114 and the zone combiners 116a, 116b. The master units 118a-d can communicate with the zone combiners 116a, 116b via any communication medium capable of carrying signals between the zone combiners 116a, 116b and the master units 118a-d. Examples of a suitable communication medium include copper wire (such as a coaxial cable), optical fiber, and microwave or optical link. The link can transport the signals in analog or in digitized form.

The master units 118a-d can provide downlink signals to the remote antenna units 120a-h. The remote antenna units 120a-h can communicate with the master units 118a-d via any communication medium capable of carrying signals between the master units 118a-d and the remote antenna units 120a-h. Examples of a suitable communication medium include copper wire (such as a coaxial cable), optical fiber, and microwave or optical link. The link can transport the signals in analog or in digitized form. The remote antenna units 120a-h can radiate the signals of the sector(s) distributed to the physical area.

In the direction of an uplink path 16, the base station routers 112a, 112b can receive uplink signals from remote antenna units 120a-h via the master units 118a-d, the zone combiners 116a, 116b, and the switch matrix 114. Uplink signals can include signals received from wireless devices in the coverage zones serviced by the remote antenna units 120a-h.

An uplink integrity detection sub-system 13 can be disposed in the DAS 10 depicted in FIG. 2. One or more components of the uplink integrity detection sub-system 13 can be disposed in one or more of the components of the DAS 10.

Noise Compensation

In some aspects, the uplink integrity detection sub-system 13 can include one or more devices for minimizing an undesirable signal component that is an excessive noise contribution by a remote antenna unit. In some aspects, the uplink integrity detection sub-system 13 can compensate for the noise contribution of remote antenna units having excessive noise figures in a DAS being commissioned. Commissioning a DAS can include installing, configuring, and calibrating the components of the DAS. In other aspects, the uplink integrity detection sub-system 13 can compensate for the noise contribution of remote antenna units having excessive noise figures in a DAS that is operating.

Figure 3:
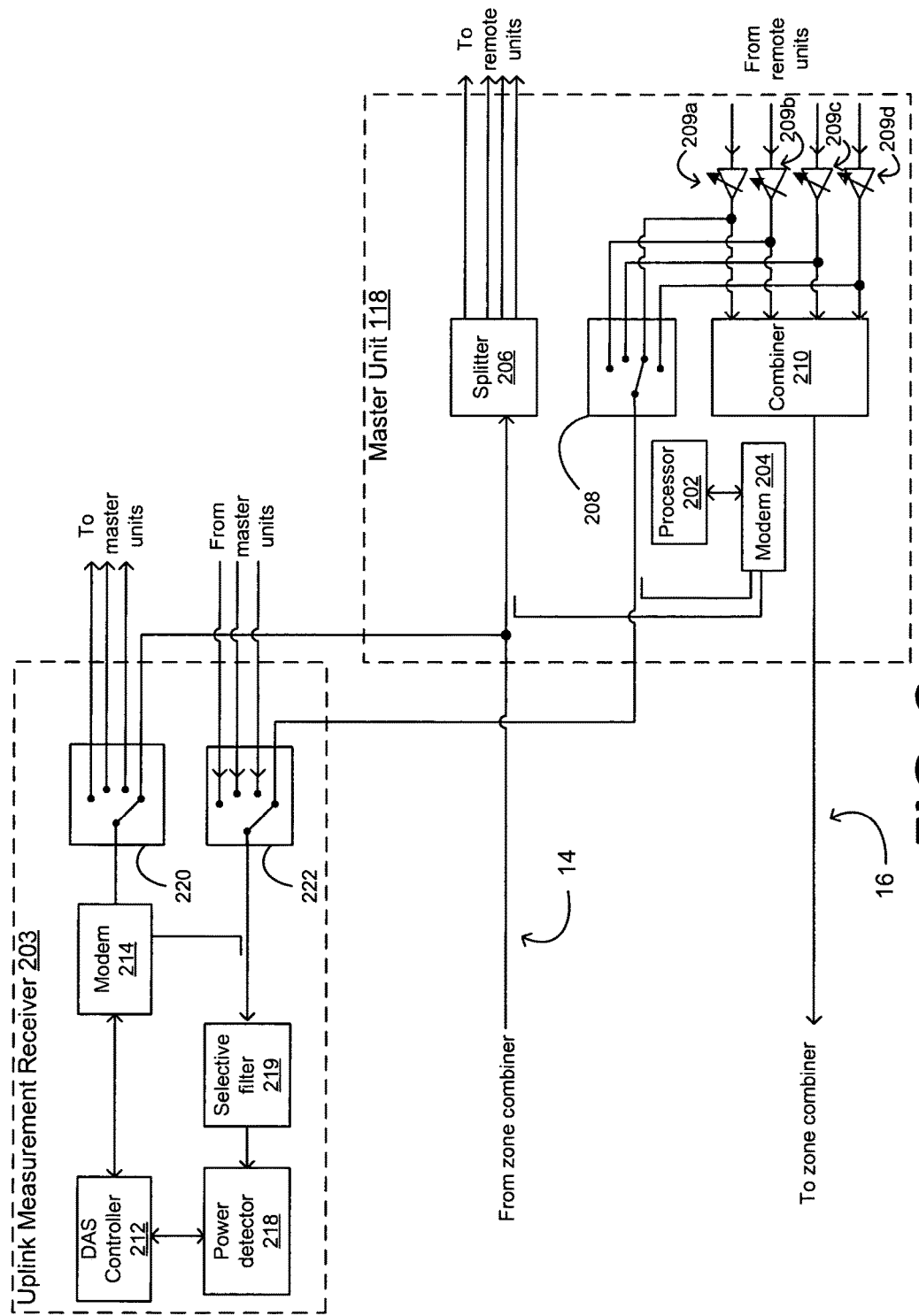
FIG. 3 is a block diagram of an uplink integrity detection sub-system including an uplink measurement receiver according to one aspect.

FIG. 3 depicts an aspect of an uplink integrity detection sub-system 13 including an uplink measurement receiver 203 and components disposed in a master unit 118.

The uplink measurement receiver can include a DAS controller 212, a modem 214, a power detector 218, a selective filter 219 and switches 220, 222. The uplink measurement receiver 203 can determine the noise figure for a test signal from each remote antenna unit. The noise figure can be measured or otherwise determined at a measurement point in the uplink path prior to a combiner, such as a summer, in the master unit. The uplink measurement receiver 203 can selectively determine the respective noise contributions and noise figures of different remote antenna units prior to a combiner in different master units.

The uplink integrity detection sub-system 13 can also include a processor 202, a modem 204, and a switch 208 disposed in the master unit 118. The master unit 118 can also include a splitter module 206 in the downlink path 14 and a combiner module 210 in the uplink path 16. Examples of the splitter module 206 can include a de-multiplexer, de-serializer, or an optical splitter. The master unit can also include programmable gain amplifiers 209a-d.

The DAS controller 212 can configure the components of the uplink integrity detection sub-system 13. An example of a DAS controller 212 is a Peripheral Interface Controller ("PIC"). The DAS controller 212 can communicate with components of the uplink integrity detection sub-system 13 disposed elsewhere in the DAS 10 (e.g., in the master units, the remote antenna units, etc.) via the modem 214. The modem 214 can communicate control signals from the DAS controller 212 with the master unit 118 via the downlink path 14 and uplink path 16. The master unit 118 can communicate with the DAS controller 212 via modem 204. The master unit 118 can also transmit control signals to the remote antenna units via the splitter module 206. The DAS controller 212 can also selectively communicate with different master units disposed in different downlink paths via switches 220, 222.

In additional or alternative aspects, the modem 214 can communicate control signals to components of the uplink integrity detection sub-system 13 disposed elsewhere in the DAS 10 via a control path separate from the downlink path 14 or uplink path 16. The control path can be any communication medium suitable for wired or wireless communication between components of the uplink integrity detection sub-system 13. Examples of a suitable communication medium include copper wire (such as a coaxial cable), optical fiber, and microwave or optical link.

The uplink measurement receiver 203 can measure the power of a test signal traversing an uplink path from a remote antenna unit being analyzed to the master unit 118 at a measurement point at the input to the combiner module 210. The combiner module 210 can combine uplink signals from different remote antenna units into a combined uplink signal. The combiner module 210 can be, for example, a summer. The master unit 118 can provide the combined uplink signal to a zone combiner. The uplink measurement receiver 203 can receive the test signal via the switch 222. The DAS controller 212 can communicate a control signal to the processor 202 of the master unit 118 to select a particular remote antenna unit via switch 208.

The power detector 218 in uplink measurement receiver 203 can measure the power of the test signal routed from a point in the uplink path 16 prior to the combiner module 210. The power detector 218 can be, for example, a logarithmic ("LOG") power detector or a root means square ("RMS") power detector. The DAS controller 212 in uplink measurement receiver 203 can select different master units via switch 222 and different uplink paths in each master unit via switch 208. The power of the test signal can be, for example, an amplification or other modification of the input power of the test signal provided to an uplink path 16 from the remote antenna unit being analyzed. The modification of the input power can be caused by the test signal traversing the uplink path 16 from a remote antenna unit 120 to the master unit 118 at the input of the combiner module 210. The power detector 218 can communicate data representing the power of the test signal to the DAS controller 212.

In some aspects, the power detector 218 can include a selective filter 219 to remove extraneous signal components from the test signal prior to the power detector 218 measuring the power of the test signal. Extraneous signal components can include, for example, signal components from uplink signals provided to the uplink path 16 by remote antenna units other than the remote antenna unit being analyzed by the uplink integrity detection sub-system 13.

In additional or alternate aspects, the uplink measurement receiver 203 can include a narrow-band filter. The narrow-band filter can reject or attenuate signal components interfering with the test signal. Examples of signal components interfering with the test signal can include uplink signals recovered during operation of the DAS.

Although FIG. 3 depicts the uplink measurement receiver 203 as a separate device, the uplink measurement receiver 203 can be disposed in other components of the DAS. The uplink measurement receiver 203 can be disposed in the DAS 10 at one or more measurement points. In some aspects, the uplink measurement receiver 203 can be disposed in one or more base station routers 112a, 112b. In other aspects, the uplink measurement receiver 203 can be disposed in one or more zone combiners 116a, 116b. In other aspects, the uplink measurement receiver 203 can be disposed in one or more master units 118a-d.

Figure 4:
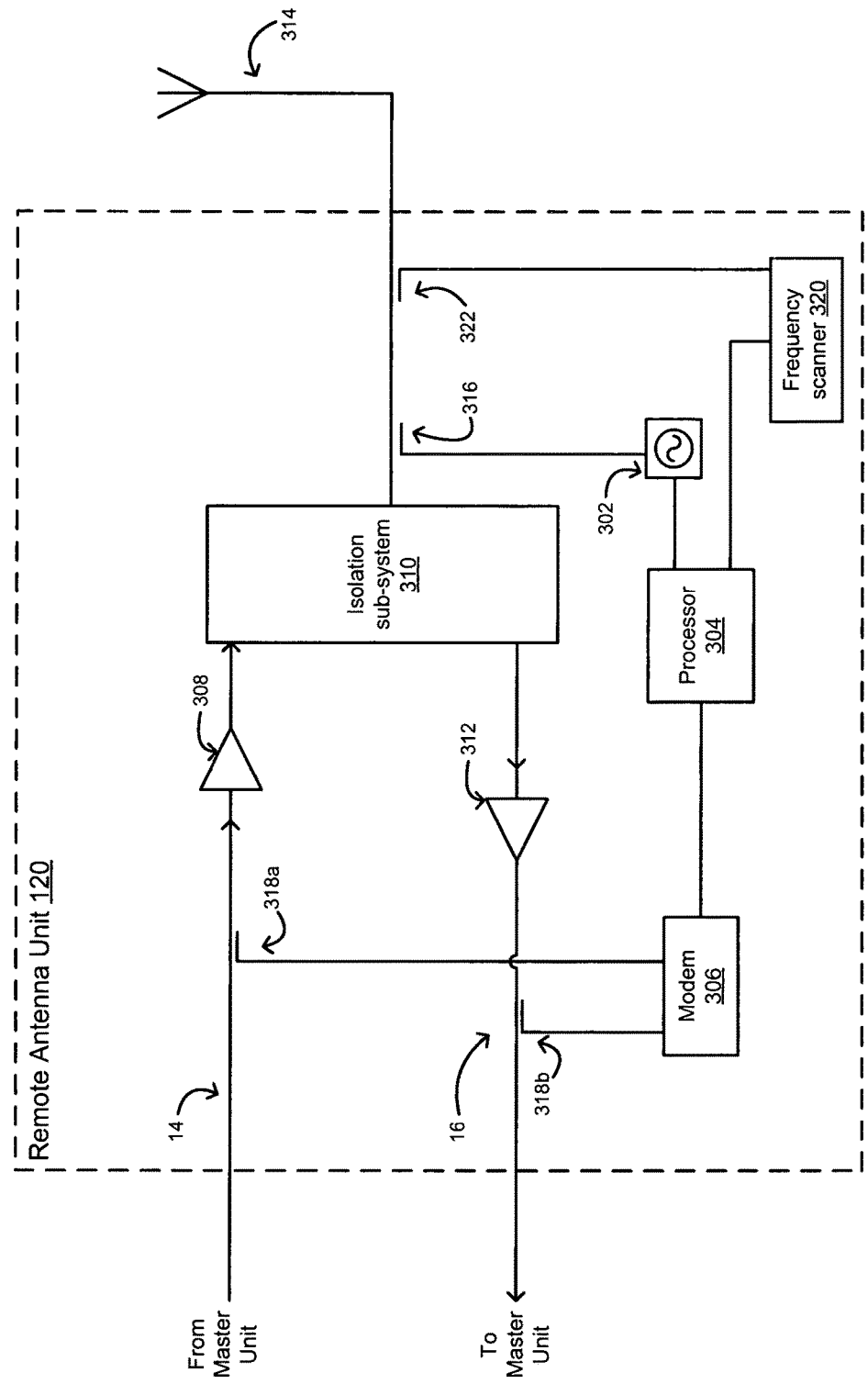
FIG. 4 is a block diagram of a remote antenna unit having a test signal generator of an uplink integrity detection sub-system according to one aspect.

A test signal can be provided to the uplink path at a remote antenna unit 120. For example, FIG. 4 depicts an aspect of a remote antenna unit 120 having a test signal generator 302 of the uplink integrity detection sub-system 13. Components of the uplink integrity detection sub-system 13 in addition to the test signal generator 302 can include the processor 304, the modem 306, and the frequency scanner 320. The remote antenna unit 120 can also include the power amplifier 308, the isolation sub-system 310, the low noise amplifier 312, and an antenna 314.

The remote antenna unit 120 can receive downlink signals via the downlink path 14 and provide uplink signals via the uplink path 16. The isolation sub-system 310 can isolate downlink signals traversing the downlink path 14 and transmitted via the antenna 314 from uplink signals traversing the uplink path 16 and recovered via the antenna 314. The isolation sub-system 310 can be, for example, a duplexer.

The test signal generator 302 can be communicatively coupled to the antenna 314. The test signal generator 302 can provide a test signal to the uplink path 16 via a coupler 316 at an uplink input to the isolation sub-system 310. The test signal generator 302 can be, for example, an analog signal generator capable of producing continuous wave tones. The test signal generator 302 can be configured by the processor 304.

The processor 304 can configure the test signal generator 302 to increase the power and/or change the frequency of the test signal in response to the control signals. The processor 304 can receive control signals from the DAS controller 212 communicated via the modem 306. In some aspects, the modem 306 at the remote antenna unit 120 can communicate with modem 214 of the uplink measurement receiver 203. In other aspects, the modem 306 at the remote antenna unit 120 can communicate with modem 204 of the master unit 118. The modem 306 can communicate with modems 204, 214 via the downlink path 14 and uplink path 16. In additional or alternative aspects, the modem 306 can communicate with modems 204, 214 via a control path. The control path can be any communication medium suitable for wired or wireless communication between components of the uplink integrity detection sub-system 13. Examples of a suitable communication medium include copper wire (such as a coaxial cable), optical fiber, and microwave or optical link.

The frequency scanner 320 can detect extraneous signals that could interfere with the testing process for the uplink integrity detection sub-system 13. Extraneous signals can include signals from other wireless devices in the coverage area of the remote antenna unit 120. The frequency scanner 320 can be coupled to antenna 314 via a directional coupler 322. The frequency scanner 320 can include a spectrum analyzer. The frequency spectrum can be analyzed, for example, by computing a Fast Fourier Transform ("FFT") of a portion of interest of a digital representation of the frequency spectrum that has been digitized. A processor, such as a processor of the spectrum analyzer, can compare the power associated with the FFT bins of an appropriate window with a power threshold that triggers an identification of an extraneous signal in the uplink path. The processor can provide a window of the FFT for the portion of the frequency spectrum used by the uplink integrity detection sub-system 13. The processor can compare the power associated with the FFT bins in the window with a threshold power associated with an extraneous signal in the uplink path. The processor can determine that an FFT bin having a power exceeding the threshold power corresponds to an extraneous signal at the frequency corresponding to the FFT bin. The processor can configure the uplink integrity detection sub-system 13 to select a frequency channel for an input signal that does not include frequencies corresponding to extraneous signals detected using the FFT.

In some aspects, the uplink integrity detection sub-system 13 can be implemented without a frequency scanner. The uplink integrity detection sub-system 13 can identify extraneous signals by generating test signals according to a pattern. The DAS controller 212 can configure the test signal generator 302 of a remote antenna unit 120 to generate a test signal of a given power and/or time interval. The DAS controller 212 can correlate the output signal having a certain power and/or at a certain time with the test signal. The DAS controller 212 can determine that an output signal not correlated with the given power and/or time interval results from an extraneous signal rather than a test signal.

The frequency scanner 320 can provide information to the processor 304 about the frequencies of extraneous signals in the coverage area of the remote antenna unit 120. The processor 304 can provide information about the frequencies of extraneous signals to the DAS controller 212. The DAS controller 212 can select a test signal frequency such that the measurement band does not include frequencies of the extraneous signals. The DAS controller 212 can communicate a control signal to the processor 304 identifying the test signal frequency. The processor 304 can configure the test signal generator 302 to use the test signal frequency within the measurement band.

In some aspects, the uplink integrity detection sub-system 13 can determine the noise figure using, for example, the signal generator twice power method. The test signal generator 302 can provide a test signal at a frequency within a measurement band to the receive antenna of the remote antenna unit. The power of the test signal provided by the test signal generator 302 can be adjusted to produce a three-decibel (dB) increase in the output power measured by the power detector. The uplink integrity detection sub-system 13 can determine the noise figure using the measurement bandwidth and the power of the signal provided by the test signal generator 302. In some aspects, the uplink integrity detection sub-system 13 can iteratively apply this method to determine the noise figure for each signal path from a remote antenna unit to the master unit communicating with the remote antenna unit.

Figure 5:
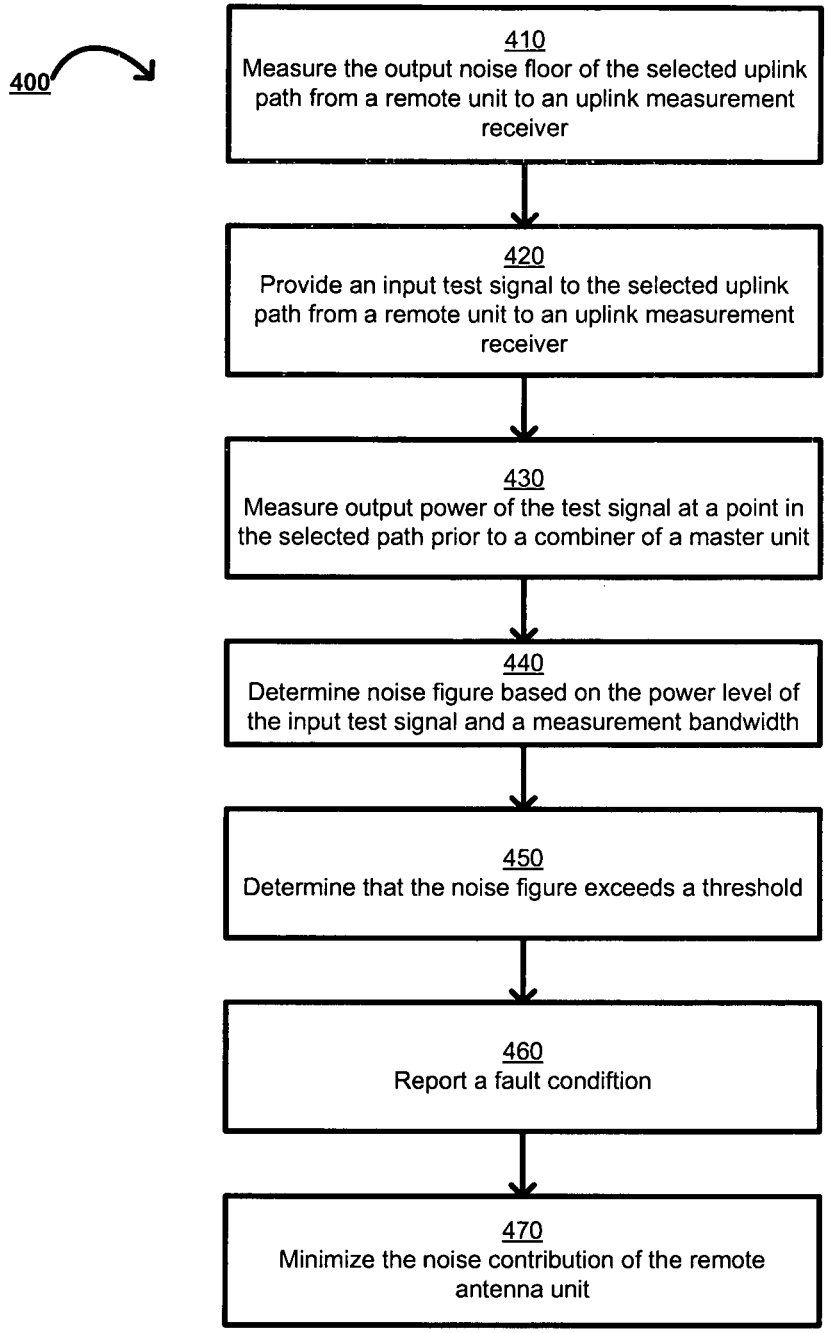
FIG. 5 is a flow chart illustrating a process for minimizing the noise contribution of a remote antenna unit having an excessive noise figure in a DAS according to one aspect.

FIG. 5 depicts a flow chart illustrating a process 400 for reducing the noise contribution of a remote antenna unit 120 in a DAS 10 having an excessive noise figure according to one aspect. The process 400 is described with reference to the DAS 10 depicted in FIG. 2 and the system implementation of the uplink integrity detection sub-system 13 depicted in FIGS. 3 and 4. Other implementations and processes, however, are possible. The DAS controller 212 can apply the process 400 to each uplink path from a remote antenna unit to the master unit 118 in a DAS.

In block 410, the uplink integrity detection sub-system 13 measures the output noise floor of an uplink path selected by the DAS controller 212 at a point prior to the combiner module 210. The DAS controller 212 can select the uplink path via the switches 222 and 208. The switches 222 and 208 can be controlled by the DAS controller 212 via the modem 214. The modem 214 can transmit control signals generated by the DAS controller 212 to the modem 204. The modem 204 can provide the control signals from the modem 214 to the processor 202. The control signals can configure the processor 202 to configure the switch 208 to select an uplink path from one of the remote antenna units. The power detector 218 can measure the output noise floor over a predetermined bandwidth. The bandwidth over which the power detector 218 accomplishes its task can be limited by the selective filter 219. The power detector 218 can provide data describing the measurement of the noise floor to the DAS controller 212.

In block 420, the uplink integrity detection sub-system provides a test signal to the input of the remote antenna unit communicating through the selected uplink path selected in block 410. The DAS controller 212 can generate a control signal to configure the test signal generator 302. The DAS controller 212 can transmit the control signal to the processor 304 via the modem 214 and the modem 306. The processor 304 can be configured by the control signal to activate the test signal generator 302. The processor 304 can configure the test signal generator 302 to be set at a frequency specified by the control signal from the DAS controller 212. The frequency can be the center frequency of the selective filter 219.

In block 430, the uplink integrity detection sub-system 13 measures an output power of the test signal traversing the uplink path selected by the uplink integrity detection sub-system 13 at a point prior to the combiner module 210. The output power can be a function of the input power as modified by the test signal traversing the uplink path selected by the uplink integrity detection sub-system 13. The power detector 218 can determine the output power of the test signal. The output power of the signal provided by the test signal generator 302 can be adjusted such that the power level detected by the power detector 218 is doubled. The DAS controller 212 can transmit a feedback signal to the processor 304 via the modem 214 and the modem 306. The processor 304 can configure the test signal generator 302 to modify the output power of the test signal based on the feedback signal such that the power level detected by the power detector 218 is doubled.

In block 440, the uplink integrity detection sub-system 13 determines a noise figure of the uplink path from the remote antenna unit 120 to the master unit 118 at a point prior to the combiner module 210 based on the output power of the test signal from the test signal generator 302. The output power of the test can be retrieved by the DAS controller 212 via a through query transmitted to the processor 304 via the modems 214, 306. The processor 304 can generate a response to the query. The response to the query can include the output power of the test signal generator 302 and the losses of the coupler 316 to the input of the isolation sub-system 310. The processor 304 can transmit the response to the DAS controller 212 via the modems 214, 306. The DAS controller 212 can compute the equivalent input power at the isolation sub-system 310 based on the output power of the test signal generator 302 and the losses of the coupler 316 to the input of the isolation sub-system 310.

The DAS controller 212 can determine the noise figure using the measurement bandwidth of the selective filter 219 and the equivalent input power at the isolation sub-system 310. For example, the noise figure NF can be calculated as NF=10 log (F), where F represents the noise factor. F can be calculated as $$F = \frac{P}{kT_oB},$$

where P represents the power of the signal provided by the test signal generator 302, $kT_o$ represents the thermal noise, and B represent the measurement bandwidth. The power detector 218 can measure the output power resulting from thermal noise of the remote antenna unit 120 (i.e., the noise level).

The DAS controller 212 can iteratively apply blocks 410-440 to determine the noise figure for each remote antenna unit. In other aspects, the DAS controller 212 can use other methods to determine the noise figure of the remote antenna unit.

In block 450, the uplink integrity detection sub-system 13 determines that the noise figure of the remote antenna unit 120 at a measurement point exceeds a threshold noise figure. The measurement point can be, for example, the input to a combiner module 210 of the master unit 118. The DAS controller 212 can determine that the noise figure of the remote antenna unit 120 exceeds a threshold noise figure by comparing the noise figure to a threshold noise figure retrieved by the DAS controller 212. The threshold noise figure can be stored in a memory accessible by the DAS controller 212. The threshold noise figure can be a noise figure associated with an excessive noise contribution from the remote antenna unit 120. The threshold noise figure can be, for example, a maximum noise figure determined for a remote antenna unit by a manufacturer in a testing environment or other production environment. An excessive noise contribution can be a noise contribution having a power exceeding the minimum power of uplink signals from other remote antenna units in communication with the master unit 118. The excessive noise contribution can decrease the sensitivity of the base station 12 connected to DAS 10, preventing the base station 12 from distinguishing uplink signals from other remote antenna units.

In block 460, the uplink integrity detection sub-system 13 can report a fault condition identifying one or more operators whose coverage is limited by a remote antenna unit having a noise figure that exceeds the threshold noise figure. The DAS controller 212 can communicate data describing the fault condition to an operator network. An operator network can include any telecommunication network communicating with user devices via the DAS 10. The DAS controller 212 can communicate the data describing the fault condition via any suitable communicative connection to the operator network. For example, the DAS controller 212 can communicate the data describing the fault condition wirelessly or via a cable connection between the DAS controller 212 and one or more devices of the operator network, such as a local area network connection.

In block 470, the uplink integrity detection sub-system 13 configures the DAS 10 to minimize the noise contribution of the faulty remote antenna unit 120. In some aspects, the DAS controller 212 can reduce the gain of an uplink path from the remote antenna unit 120. Reducing the gain of the uplink path from the remote antenna unit 120 can reduce the signal coverage of the remote antenna unit 120 in a coverage area serviced by the remote antenna unit 120. In other aspects, the DAS controller 212 can increase the gain of the respective uplink paths from one or more other remote antenna units in communication with the master unit 118. Increasing the gain of the respective uplink paths from one or more other remote antenna units can shift the dynamic window of the master unit 118 having a large number of wireless devices in the coverage areas serviced by the remote antenna units in communication with the master unit 118. In other aspects, the DAS controller 212 can adjust the gain of an uplink path from the remote antenna unit by the ratio between the threshold noise floor and the measured noise floor of the uplink path amplified by the faulty remote antenna unit and the master unit 118. The threshold noise floor is the thermal noise multiplied by the threshold noise factor and by the nominal gain of an uplink path.

In additional or alternative aspects, the noise contribution from each of the remote antenna units 120 can be equalized. In some aspects, the noise contributions can be equalized by increasing the gain of uplink paths from remote antenna units with lower noise figure or lower noise level. In other aspects, the noise contributions can be equalized by decreasing the gain of one or more uplink paths from remote antenna units with higher noise figure or higher noise level.

In other aspects, a combination of increasing the gain of one or more uplink paths from remote antenna units with lower noise figures or lower noise levels and decreasing the gain of one or more uplink paths from remote antenna units with higher noise figures or higher noise levels can be used.

Figure 6:
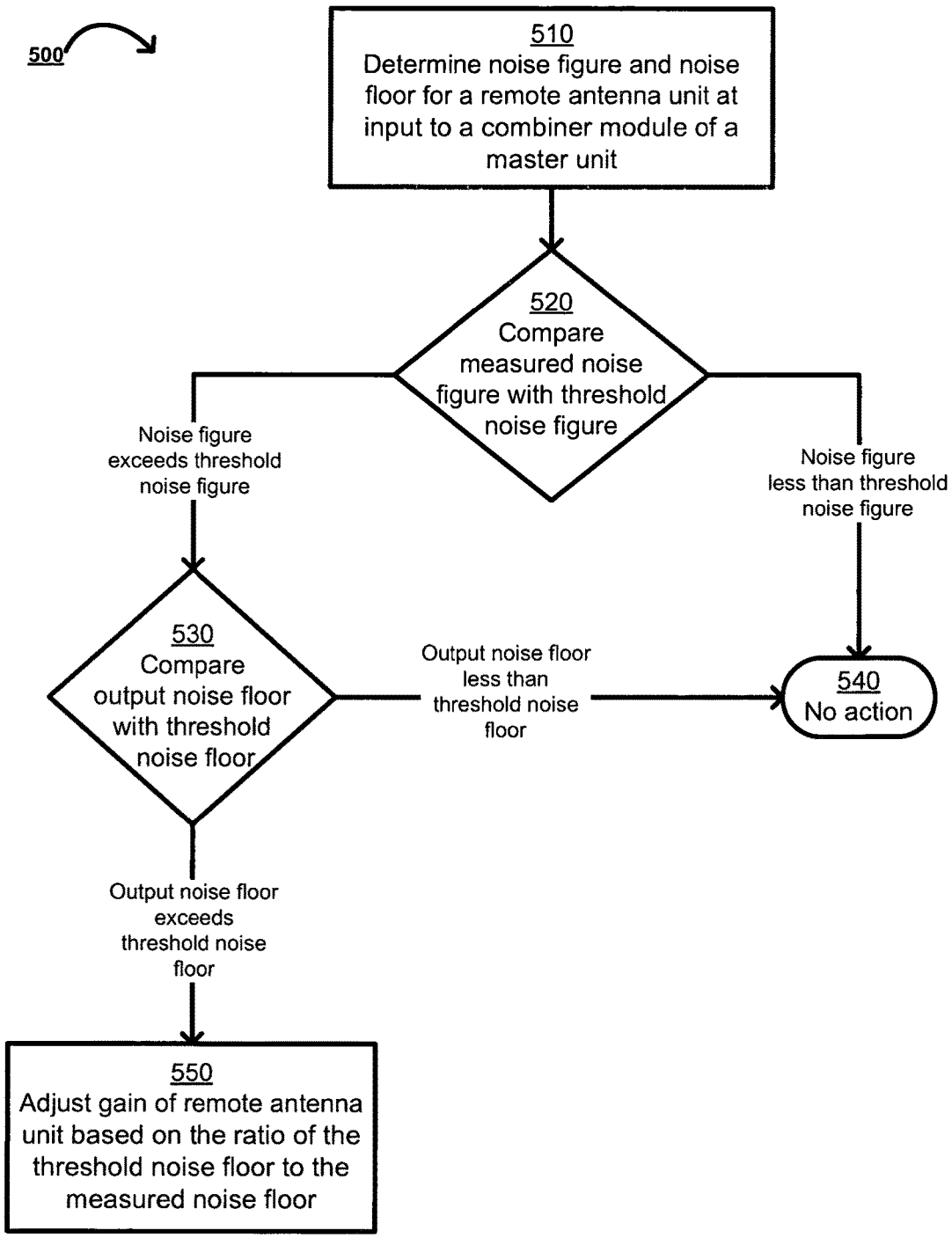
FIG. 6 depicts a flow chart illustrating a process for reducing the noise contribution of remote antenna units in a DAS according to one aspect.

FIG. 6 depicts a flow chart illustrating a process 500 for reducing the noise contribution of remote antenna units in a DAS according to one aspect. The process 500 is described with reference to the DAS 10 depicted in FIG. 2 and the system implementation of the uplink integrity detection sub-system 13 depicted in FIGS. 3 and 4. Other implementations and processes, however, are possible.

In block 510, the uplink integrity detection sub-system 13 determines the noise figure and the noise floor for a remote antenna unit 120 at the input to a combiner module 210 of a master unit 118. In some aspects, DAS controller 212 can use the signal generator twice power method to determine the noise figure for the remote antenna unit 120, as described above with respect to blocks 410, 420, 430, 440 of process 400. In other aspects, the DAS controller 212 can use other methods to determine the noise figure of the remote antenna unit.

In some aspects, the noise contribution of a remote antenna unit 120 can be determined using the noise floor without determining the noise figure.

In block 520, the uplink integrity detection sub-system 13 compares the noise figure associated with remote antenna unit 120 to a threshold noise figure associated with a nominal gain for the uplink path from the remote antenna unit 120 to the master unit 118. The nominal gain of the uplink path from the remote antenna unit 120 to the master unit 118 can be a gain for the path determined in a testing environment or other production environment.

If the noise figure is less than the threshold noise figure, the uplink integrity detection sub-system 13 terminates at block 540.

If the noise figure exceeds the threshold noise figure, the uplink integrity detection sub-system 13 compares the output noise floor with threshold noise floor in block 530. If the measured noise floor is less than the threshold noise floor, the process 500 terminates at block 540.

If the output noise floor exceeds the threshold noise floor, the uplink integrity detection sub-system 13 adjusts the gain of an uplink path from the remote antenna unit 120 in block 550. The amount of gain adjustment can be determined based on the ratio of the threshold noise floor to the measured noise floor. For example, the adjust gain can be the ratio of the threshold noise floor to the measured noise floor. The gain can be adjusted by modifying the programmable gain of one of the amplifiers 209a-d in the uplink path from the faulty remote antenna unit. The DAS controller 212 can transmit a control signal to the processor 202 via the modems 204, 214 causing the processor 202 to adjust the gain of the amplifier.

Uplink Interference Signals

In additional or alternative aspects, the uplink integrity detection sub-system 13 can include one or more devices for minimizing or otherwise controlling an undesirable signal component that is an interfering signal received by a remote antenna unit.

Figure 7:
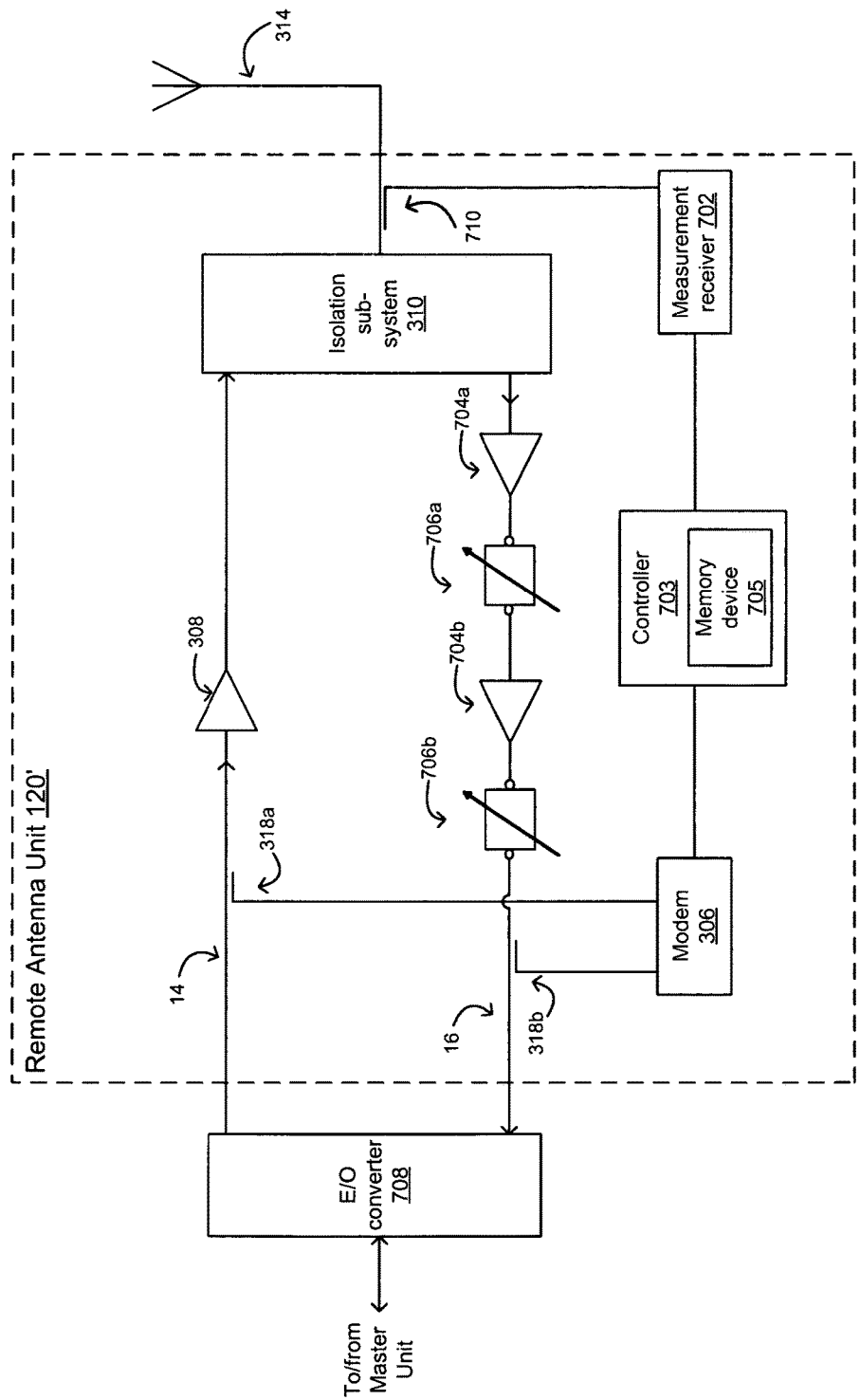
FIG. 7 is a block diagram of components of an uplink integrity detection sub-system included in a remote antenna unit for minimizing interfering signals according to one aspect.

FIG. 7 depicts an example of a remote antenna unit 120' including components of the uplink integrity detection sub-system 13 for minimizing or otherwise controlling interfering signals in the uplink path 16 from the remote antenna unit 120' to a master unit. Components of the uplink integrity detection sub-system 13 included in the remote antenna unit 120' can include a measurement receiver 702, a controller 703, amplifiers 704a, 704b, and attenuators 706a, 706b. The remote antenna unit 120' can also include the modem 306, the power amplifier 308, the isolation sub-system 310, the power amplifier 308, and an antenna 314.

The remote antenna unit 120' can receive downlink signals via the downlink path 14 and provide uplink signals via the uplink path 16. The isolation sub-system 310 can isolate downlink signals traversing the downlink path 14 and transmitted via the antenna 314 from uplink signals traversing the uplink path 16 and recovered via the antenna 314. The isolation sub-system 310 can be, for example, a duplexer.

An interfering signal can be any extraneous signal recovered by the antenna 314 having a frequency within an uplink frequency band. Extraneous signals can include signals from other wireless devices in the coverage area of the remote antenna unit 120'. For example, a wireless device within a coverage area serviced by the remote antenna unit 120' may be configured to communicate via a different telecommunication system than the DAS 10. Such a wireless device may be configured to transmit signals to a base station located at a greater distance from the remote device than the remote antenna unit 120'. The wireless device may transmit signals to the base station at a higher power than wireless devices configured to communicate via the DAS 10. Interfering signals transmitted at a frequency within the uplink frequency band having a higher signal power than uplink signals intended to be communicated via the DAS 10 can be transmitted to a master unit by the remote antenna unit 120'. Combing the interfering signal with uplink signals from other remote antenna units at a master unit can prevent uplink signals from other remote antenna units from being distinguished from the interfering signal transmitted by the remote antenna unit 120'. Another example of interfering signals can include two extraneous signals that can create intermodulation signal products having a frequency within an uplink frequency band.

The measurement receiver 702 can measure the signal power of an interfering signal received by the remote antenna unit 120' via the antenna 314. The measurement receiver 702 can periodically scan the uplink frequency spectrum to detect interfering signals. For example, the measurement receiver 702 can be configured to scan the uplink frequency spectrum every 150 milliseconds. The measurement receiver 702 can be configured to identify signals having a signal power above a threshold signal power. For example, interfering signals from wireless devices not communicating via the DAS 10 may have a signal power above the threshold signal power used by wireless devices communicating via the DAS 10. A non-limiting example of a measurement receiver 702 is a channel power detector.

The measurement receiver 702 can be coupled to the antenna 314 via a directional coupler 710. The measurement receiver 702 can include a spectrum analyzer. The frequency spectrum can be analyzed, for example, by computing an FFT of a portion of a digital representation of the frequency spectrum. A processor, such as a processor of the spectrum analyzer, can provide a window of the FFT for the portion of the frequency spectrum used by the uplink integrity detection sub-system 13. The processor can compare the power associated with the FFT bins in the window with a threshold power associated with an extraneous signal in the uplink path. The processor can determine that an FFT bin having a power exceeding the threshold power corresponds to an interfering signal at the frequency corresponding to the FFT bin.

The measurement receiver 702 can communicate data to the controller 703 identifying the interfering signal. The controller 703 can include any suitable processing device or group of devices. A non-limiting example of a controller 703 is a PIC. In some aspects, the measurement receiver 702 can communicate data identifying the interfering signal upon detecting the interfering signal. In other aspects, the controller 703 can periodically request that the measurement receiver 702 communicate data identifying the interfering signal.

The controller 703 can generate a control signal for configuring one or more of the amplifiers 704a, 704b and the attenuators 706a, 706b. The controller 703 can communicate with the amplifiers 704a, 704b and the attenuators 706a, 706b via any suitable mechanism, such as a bus (not depicted). Configuring one or more of the amplifiers 704a, 704b and the attenuators 706a, 706b can include modifying the gain of the uplink signals transmitted by the remote antenna unit 120'.

For example, the controller 703 can receive data from the measurement receiver 702 identifying an amplitude and a frequency of an interfering signal. The controller 703 can access one or more data files from a memory device 705, such as a firmware module. The one or more data files can include specifications for modifying the gain of an uplink signal that includes the interfering signal. The specifications can identify different gain adjustments for different gain stages. For example, an acceptable signal power for an uplink signal may be −40 dBm. An interfering signal may have a signal power of −39 dBm. The controller 703 may configure a first gain stage including amplifier 704a and attenuator 706a to attenuate all uplink signals by 1 dB. The specifications can also identify different gain adjustments specific to different interfering signals.

The gain adjusted uplink signal can be converted from an electrical signal to an optical signal via an electrical-optical ("E/O") converter 708 for transmission to a master unit.

In some aspects, the controller 703 can generate control messages to be communicated to a DAS controller. A control message can specify an additional amount of gain adjustment of the uplink signal including the interfering signal. The control messages can be transmitted to a DAS controller disposed in a device at another point in the uplink path 16, such as a master unit. In some aspects, modem 306 at the remote antenna unit 120' can communicate the control message with a modem of another device in the uplink path 16 via signals transmitted via the uplink path 16. In additional or alternative aspects, the modem 306 can communicate with other devices via a control path. The control path can be any communication medium suitable for wired or wireless communication between components of the uplink integrity detection sub-system 13. Examples of a suitable communication medium include copper wire (such as a coaxial cable), optical fiber, and microwave or optical link.

Figure 8:
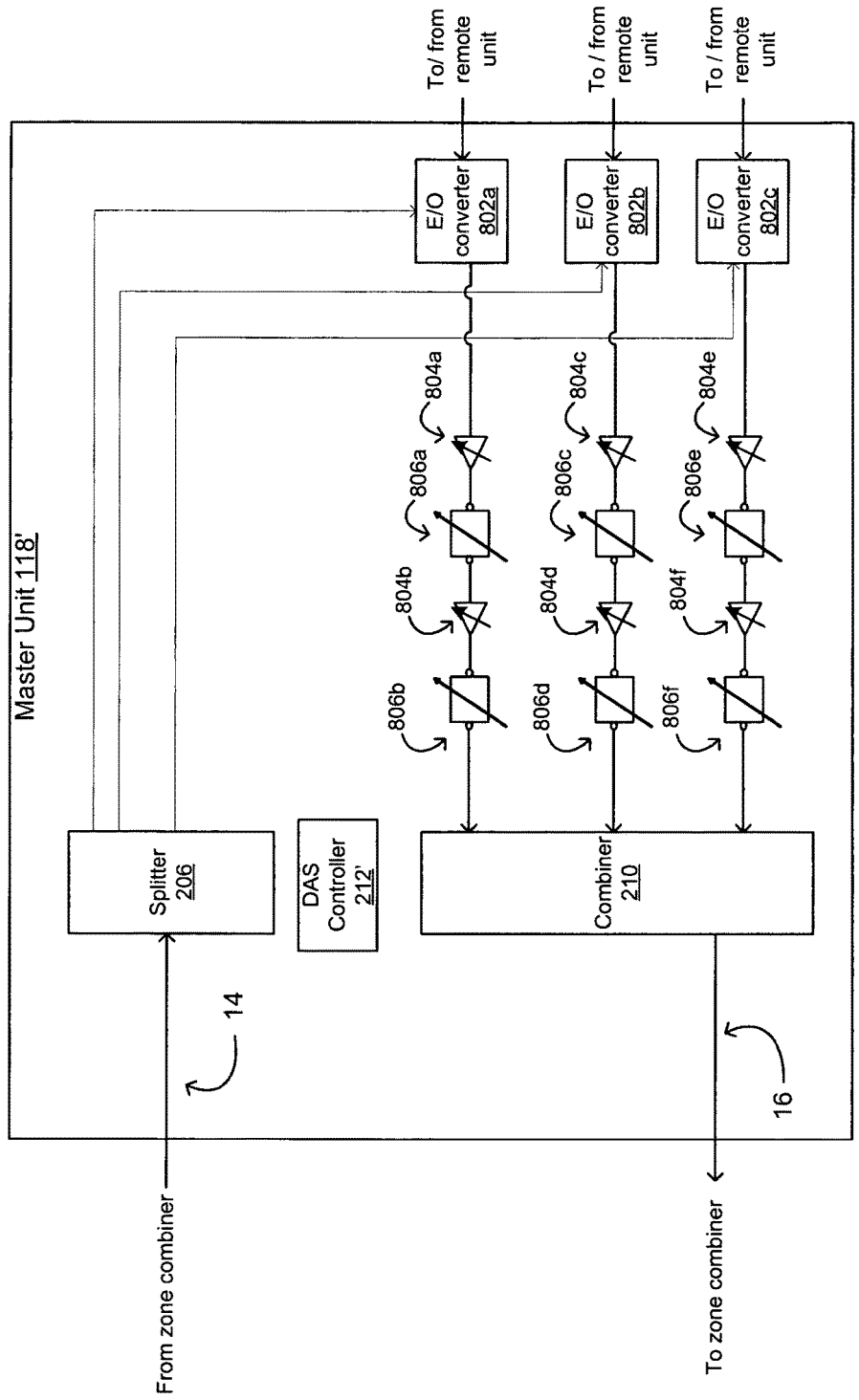
FIG. 8 is a block diagram of components of an uplink integrity detection sub-system included in a master unit for minimizing interfering signals according to one aspect.

In some aspects, a master unit can include additional components of the uplink integrity detection sub-system 13 for minimizing or otherwise controlling an interfering uplink signal received by a remote antenna unit. For example, FIG. 8 depicts an example of a master unit 118' including components of the uplink integrity detection sub-system 13 for minimizing or otherwise controlling interfering signals in the uplink path 16 from the remote antenna unit 120'. Components of the uplink integrity detection sub-system 13 disposed in the master unit 118' can include a DAS controller 212', amplifiers 804a-f, and attenuators 806a-f. The master unit 118' can also include a splitter module 206 in the downlink path 14 and a combiner module 210 in the uplink path 16. Examples of the splitter module 206 can include a de-multiplexer, de-serializer, or an optical splitter.

The master unit 118' can receive optical uplink signals from multiple remote units. The optical uplink signals can be converted to electrical uplink signals by the E/O converters 802*a-c*, gain adjusted by one or more of the amplifiers 804*a-f* and attenuators 806*a-f*, and combined via the combiner module 210 for transmission via the uplink path 16.

The DAS controller 212' can configure one or more of the amplifiers 804*a-f* and attenuators 806*a-f* based on a control message received from a remote antenna unit 120'. An example of a DAS controller 212' is a PIC. In some aspects, a control message can specify that the gain of the uplink signal including the interfering signal should be increased to offset an attenuation of the gain at the remote antenna unit 120'. The DAS controller 212' can configure one or more of the amplifiers 804*a-f* and attenuators 806*a-f* in the uplink path from the remote antenna unit 120' to amplify the uplink signal. In other aspects, a control message can specify that the gain of the uplink signal including the interfering signal should be attenuated. The DAS controller 212' can configure one or more of the amplifiers 804*a-f* and attenuators 806*a-f* in the uplink path from the remote antenna unit 120' to attenuate the uplink signal. Configuring the amplifiers 804*a-f* and attenuators 806*a-f* can include, for example, providing a control signal to the amplifiers 804*a-f* and attenuators 806*a-f* specifying the gain adjustment.

The master unit 118' can receive combined downlink signals via the downlink path 14. The combined downlink signals can be transmitted to individual remote antenna units via the splitter module 206. Electrical downlink signals can be converted to optical downlink signals by the E/O converters 802*a-c*.

The master unit 118' can communicate periodically with the remote antenna unit 120' to determine whether to configure one or more of the amplifiers 804*a-f* and attenuators 806*a-f* to amplify or attenuate an uplink signal. For example, a master unit 118' can configure one or more of the amplifiers 804*a-f* and attenuators 806*a-f* to amplify or attenuate an uplink signal in response to the remote antenna unit 120' communicating a control message identifying an interfering signal. The master unit 118' can re-configure one or more of the amplifiers 804*a-f* and attenuators 806*a-f* in response to a second control message from the remote antenna unit 120' notifying the master unit 118' that remote antenna unit 120' has ceased receiving the interfering signal.

Although FIG. 8 depicts a master unit 118' in communication with three remote antenna units, a master unit 118' can be configured to communicate with any number of remote antenna units.

Although an uplink integrity detection sub-system is described with respect to a DAS, other implementations are possible. For example, the uplink integrity detection sub-system depicted in FIGS. 7 and 8 can be implemented in a repeater.

The foregoing description of the aspects, including illustrated aspects, of the invention has been presented only for the purpose of illustration and description and is not intended to be exhaustive or to limit the invention to the precise forms disclosed. Numerous modifications, adaptations, and uses thereof will be apparent to those skilled in the art without departing from the scope of this invention.

The invention claimed is:

1. A distributed antenna system comprising:
a remote antenna unit configured to communicate with wireless devices in a coverage area;
one or more additional remote antenna units configured to communicate with wireless devices in one or more additional coverage areas; and
a unit configured for communicating with the remote antenna unit and the one or more additional remote antenna units, the unit comprising a distributed antenna system controller that is configured to:
determine that an undesirable signal component having a signal power exceeding a threshold power is communicated via an uplink path from the remote antenna unit; and
minimize an impact of the undesirable signal component on the additional coverage areas of the one or more additional remote antenna units, wherein minimizing the impact comprises modifying the gain of the uplink path over which the undesirable signal component is communicated as a function of a measured signal power of the undesirable signal component in the uplink path from the remote antenna unit.

2. The distributed antenna system of claim 1,
wherein the distributed antenna system controller is configured to determine that the undesirable signal component having the signal power exceeding the threshold power is communicated via the uplink path from the remote antenna unit by:
determining, based on an output power of a test signal traversing the uplink path, a noise figure of the remote antenna unit, and
determining that the noise figure of the remote antenna unit exceeds a threshold noise figure; and
wherein the distributed antenna system controller is configured to minimize the undesirable signal component by minimizing a noise contribution of the remote antenna unit.

3. The distributed antenna system of claim 2, wherein the distributed antenna system controller is configured to determine the noise figure based on the output power, a measurement bandwidth, and an input power of the test signal.

4. The distributed antenna system of claim 2, wherein the distributed antenna system controller is configured to minimize the noise contribution of the remote antenna unit by reducing the gain of the uplink path over which the undesirable signal component is communicated.

5. The distributed antenna system of claim 2, wherein the unit is one of a master unit, a zone combiner, or a base station router.

6. The distributed antenna system of claim 2, further comprising a test signal generator disposed in the remote antenna unit, wherein the test signal generator is configured to provide the test signal.

7. The distributed antenna system of claim 6,
further comprising a frequency scanner, wherein the frequency scanner is configured to determine respective frequencies of one or more extraneous signals in the coverage area of the remote antenna unit; and
wherein the test signal generator is configured to provide the test signal at a test frequency such that a measurement bandwidth does not include the respective frequencies of the one or more extraneous signals.

8. The distributed antenna system of claim 2, further comprising a power detector disposed in the unit, wherein the power detector is configured to measure the output power at an input to a combiner module of a master unit.

9. The distributed antenna system of claim 2, further comprising a narrow-band filter disposed in the unit, the narrow-band filter configured to attenuate extraneous signals interfering with the test signal.

10. The distributed antenna system of claim 1, wherein the undesirable signal component comprises an interfering signal received by the remote antenna unit and wherein the remote antenna unit comprises:
   a measurement receiver configured to measure the signal power of the interfering signal;
   a controller configured to:
      determine that the signal power of the interfering signal exceeds a threshold signal power;
      configure an attenuator disposed in the remote antenna unit to attenuate the interfering signal based on the signal power of the interfering signal; and
      generate a control message for the distributed antenna system controller, the control message identifying an amount of gain adjustment of the uplink path over which the interfering signal is communicated based on the signal power of the interfering signal; and
   wherein the distributed antenna system controller is configured to minimize the undesirable signal component by providing a control signal to a gain adjustment device of the unit, the control signal configuring the gain adjustment device to adjust the gain of the uplink path over which the interfering signal is communicated by the amount of gain adjustment.

11. The distributed antenna system of claim 10, wherein the gain adjustment device of the unit comprises an amplifier configured to increase the gain of the uplink path over which the interfering signal is communicated in response to the control signal.

12. The distributed antenna system of claim 10, wherein the gain adjustment device of the unit comprises an attenuator configured to attenuate the gain of the uplink path over which the interfering signal is communicated in response to the control signal.

13. An uplink integrity detection sub-system, comprising:
   a test signal generator disposed in a remote antenna unit of a distributed antenna system, wherein the test signal generator is configured to provide a test signal to an uplink path of the distributed antenna system;
   a power detector disposed in a unit, the unit in communication with a plurality of remote antenna units of the distributed antenna system, wherein the power detector is configured to measure at a measurement point an output power of the test signal, wherein the output power of the test signal comprises a function of an input power of the test signal as modified by the test signal traversing the uplink path from the remote antenna unit; and
   a distributed antenna system controller disposed in the unit, wherein the distributed antenna system controller is configured to determine a noise figure of the remote antenna unit based on the output power of the test signal and the input power of the test signal.

14. The uplink integrity detection sub-system of claim 13, wherein the distributed antenna system controller is further configured to:
   determine that the noise figure of the remote antenna unit exceeds a threshold noise figure; and
   minimize a noise contribution of the remote antenna unit.

15. The uplink integrity detection sub-system of claim 14, wherein the distributed antenna system controller is configured to minimize the noise contribution of the remote antenna unit by reducing the gain of the uplink path from the remote antenna unit.

16. The uplink integrity detection sub-system of claim 15, wherein the distributed antenna system controller is configured to determine the noise figure based on the output power, a measurement bandwidth, and the input power of the test signal provided by the test signal generator.

17. The uplink integrity detection sub-system of claim 13, further comprising:
   a measurement receiver disposed in the remote antenna unit, the measurement receiver configured to measure the signal power of an interfering signal communicated via the uplink path from the remote antenna unit;
   a controller disposed in the remote antenna unit, the controller configured to:
      determine that the signal power of the interfering signal exceeds a threshold signal power; and
      configure an attenuator disposed in the remote antenna unit to attenuate an uplink signal including the interfering signal based on the signal power of the interfering signal.

18. An uplink integrity detection sub-system, comprising:
   a remote antenna unit of a distributed antenna system;
   wherein the remote antenna unit comprises:
   a measurement receiver configured to measure the signal power of an undesirable signal component having a frequency in an uplink frequency band used by the remote antenna unit for communicating uplink signals;
   a controller configured to:
      determine that the signal power of the undesirable signal component exceeds a threshold signal power; and
      configure an attenuator disposed in the remote antenna unit to attenuate an uplink signal including the undesirable signal component based on the signal power of the undesirable signal component.

19. The uplink integrity detection sub-system of claim 18, wherein the remote antenna unit is in communication with a unit, the unit in communication with a plurality of remote antenna units of the distributed antenna system,
   wherein the controller is further configured to generate a control message for the unit, the control message identifying an amount of gain adjustment by the unit of an uplink path from the remote antenna unit,
   wherein the uplink integrity detection sub-system further comprises a distributed antenna system controller disposed in the unit, wherein the distributed antenna system controller is configured to provide a control signal to a gain adjustment device of the unit, the control signal configuring the gain adjustment device to adjust the gain of the uplink path by the amount of gain adjustment.

20. The uplink integrity detection sub-system of claim 19, wherein the gain adjustment device of the unit comprises an amplifier configured to increase the gain of the uplink signal in response to the control signal.

21. The uplink integrity detection sub-system of claim 19, wherein the gain adjustment device of the unit comprises an attenuator configured to attenuate the uplink signal in response to the control signal.

22. The uplink integrity detection sub-system of claim 18, wherein the remote antenna unit is in communication with a unit, the unit in communication with a plurality of remote antenna units of the distributed antenna system;
   wherein the undesirable signal component comprises a noise contribution of the remote antenna unit; and
   wherein the uplink integrity detection sub-system further comprises:
   a test signal generator disposed in the remote antenna unit, wherein the test signal generator is configured to provide a test signal to an uplink path from the remote antenna unit to the unit;

a power detector disposed in the unit, wherein the power detector is configured to measure at a measurement point an output power of the test signal, wherein the output power of the test signal comprises a function of an input power of the test signal as modified by the test signal traversing the uplink path; and a distributed antenna system controller disposed in the unit, wherein the distributed antenna system controller is configured to:

determine a noise figure of the remote antenna unit based on the output power of the test signal and the input power of the test signal;

determine that the noise figure of the remote antenna unit exceeds a threshold noise figure; and minimize the noise contribution of the remote antenna unit based on the noise figure of the remote antenna unit.

23. The uplink integrity detection sub-system of claim 18, wherein the undesirable signal component comprises an intermodulation product having a frequency within the uplink frequency band, wherein the intermodulation product is generated by extraneous signals received by the remote antenna unit.

\* \* \* \* \*